United States Patent
McCormack et al.

(10) Patent No.: US 7,236,084 B2
(45) Date of Patent: *Jun. 26, 2007

(54) CROSSPOINT SWITCH WITH SWITCH MATRIX MODULE

(75) Inventors: Gary McCormack, Tigard, OR (US);
Ian A. Kyles, West Linn, OR (US);
Angus J. McCamant, Aloha, OR (US);
Norbert J. Seitz, Beaverton, OR (US);
Richard R. Suter, Beaverton, OR (US)

(73) Assignee: Vitesse Semiconductor Corporation, Camarillo, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 11/231,320

(22) Filed: Sep. 20, 2005

(65) Prior Publication Data

US 2006/0097841 A1    May 11, 2006

Related U.S. Application Data

(63) Continuation of application No. 09/878,054, filed on Jun. 6, 2001, now Pat. No. 6,946,948.

(60) Provisional application No. 60/227,550, filed on Aug. 23, 2000, provisional application No. 60/209,552, filed on Jun. 6, 2000.

(51) Int. Cl.
   *H04Q 1/00* (2006.01)

(52) U.S. Cl. .................. 340/2.28; 327/307; 257/701
(58) Field of Classification Search ............. 340/2.28, 340/2.27; 327/307; 361/277; 338/295; 257/701; 716/17
See application file for complete search history.

(56) References Cited

U.S. PATENT DOCUMENTS

| | | |
|---|---|---|
| 3,597,547 A | 8/1971 | Roll |
| 3,798,378 A | 3/1974 | Epstein |

(Continued)

OTHER PUBLICATIONS

Anagnostou et al., "Study of LVDS Serial Links For The ATLAS Level-1 Calorimeter Trigger", Mar. 2000 (p. 3-4).

(Continued)

*Primary Examiner*—Brian Zimmerman
(74) *Attorney, Agent, or Firm*—Christie, Parker & Hale, LLP

(57) ABSTRACT

A crosspoint switch including a switch matrix modules and programming features. A switch matrix modules include input lines tied to inputs of the switch through precompensation networks. The programming features include user initialization states and reduced and grouping command configuration operations.

7 Claims, 15 Drawing Sheets

U.S. PATENT DOCUMENTS

| | | | |
|---|---|---|---|
| 4,271,508 A | 6/1981 | Schenk | |
| 4,605,928 A | 8/1986 | Georgiou | |
| 4,630,045 A | 12/1986 | Georgiou | |
| 4,646,300 A | 2/1987 | Goodman et al. | |
| 4,665,533 A | 5/1987 | Tomikawa | |
| 4,719,624 A | 1/1988 | Bellisio | |
| 4,752,777 A | 6/1988 | Franaszek | |
| 4,777,640 A | 10/1988 | Turner et al. | |
| 4,821,258 A | 4/1989 | Fraser | |
| 5,058,130 A | 10/1991 | Park | |
| 5,084,871 A | 1/1992 | Carn et al. | |
| 5,148,113 A | 9/1992 | Wight et al. | |
| 5,245,603 A | 9/1993 | Newman | |
| 5,285,482 A | 2/1994 | Seheir et al. | |
| 5,341,369 A | 8/1994 | Langer | |
| 5,359,630 A | 10/1994 | Wade et al. | |
| 5,367,520 A | 11/1994 | Cordell | |
| 5,446,424 A | 8/1995 | Pierro | |
| 5,452,229 A | 9/1995 | Shankar et al. | |
| 5,452,306 A | 9/1995 | Turudic et al. | |
| 5,481,563 A | 1/1996 | Hamre | |
| 5,509,008 A | 4/1996 | Genda et al. | |
| 5,511,070 A | 4/1996 | Lyles | |
| 5,519,698 A | 5/1996 | Lyles et al. | |
| 5,528,637 A | 6/1996 | Sevenhans et al. | |
| 5,541,916 A | 7/1996 | Nobuyuki | |
| 5,598,443 A | 1/1997 | Poeppleman | |
| 5,604,735 A | 2/1997 | Levinson et al. | |
| 5,612,664 A | 3/1997 | Hilgenberg et al. | |
| 5,654,815 A | 8/1997 | Bunse | |
| 5,654,987 A | 8/1997 | Nakamura | |
| 5,686,905 A | 11/1997 | Murata et al. | |
| 5,689,530 A | 11/1997 | Honaker et al. | |
| 5,689,533 A | 11/1997 | Brauns et al. | |
| 5,696,800 A | 12/1997 | Berger | |
| 5,717,728 A | 2/1998 | Hein et al. | |
| 5,719,908 A | 2/1998 | Greeff et al. | |
| 5,732,339 A | 3/1998 | Auvray et al. | |
| 5,745,530 A | 4/1998 | Baek et al. | |
| 5,757,652 A | 5/1998 | Blazo et al. | |
| 5,757,857 A | 5/1998 | Buchwald | |
| 5,757,872 A | 5/1998 | Banu et al. | |
| 5,761,254 A | 6/1998 | Behrin | |
| 5,818,349 A | 10/1998 | Dayton | |
| 5,908,468 A | 6/1999 | Hartmann | |
| 5,977,624 A | 11/1999 | Heo et al. | |
| 6,018,782 A | 1/2000 | Hartmann | |
| 6,167,080 A | 12/2000 | Hee et al. | |
| 6,198,309 B1 | 3/2001 | Smetana | |
| 6,236,254 B1 | 5/2001 | Morgan et al. | |

OTHER PUBLICATIONS

Huq et al., "An Overview of LVDS Technology", National Semiconductor, Application Note 971, Jul. 1998 (p. 1-6).

Kyles, "Architecting Large Switch Fabrics For Fiber-Optic Systems", Communication System Design Magazine, Jul. 2000 (14 pgs.).

International Search Report of Application No. PCT/US01/40891 dated Aug. 3, 2001 and mailed Aug. 24, 2001.

CROSSPOINT SWITCH WITH SWITCH MATRIX MODULE

CROSS REFERENCE TO RELATED APPLICATIONS

This application is a continuation of U.S. patent application Ser. No. 09/878,054, filed Jun. 6, 2001 and to issue as U.S. Pat. No. 6,946,948 on Sep. 20, 2005, which claims the benefit of the filing dates of U.S. Provisional Application entitled Switch Matrix Module (Application No. 60/209,552) filed on Jun. 6, 2000, and U.S. Provisional Application entitled Pre-Compensation System and Method For Reducing Inter-Symbol Interference (Application No. 60/227,550) filed Aug. 23, 2000 all of which are hereby incorporated by reference as if set forth in full herein.

BACKGROUND OF THE INVENTION

The present invention relates generally to integrated circuits, and more particularly to cross switches.

Cross switches are often used to route data from a variety of inputs to a variety of outputs. With ever-increasing data communication needs, the number of inputs and outputs to cross switches has often been subject to increase. Moreover, as nodes are often in communication with a number of other nodes, the connections between outputs and inputs often require reconfiguration during operation of the switch.

Increasing the numbers of inputs and outputs to a switch generally results in increased die area, power usage, heat generation, and complexity of the switch. For example, a switch may receive input signals, generate internal signals corresponding to the input signals using active elements within the switch, control connections between input lines and output lines using active elements, and drive output signals using additional active elements. As the number of inputs and outputs grow, so do the size, power and other requirements of the switch. In many cases these constraints limit the number of inputs and outputs available on a particular integrated circuit forming a switch.

One method for providing increased number of inputs and outputs is to combine several switch devices into a single switch. The switch devices may be combined, for example, as a three stage Clos network, a Benes network, or a square crossbar switch. Generally, a three stage Clos network and a Benes network are more efficient in terms of minimizing the number of switch devices ($N^{3/2}$ and NlogN respectively) but may be more complex in programming or scalability. For a square crossbar switch the number of devices increases by $N^2$, but greater simplicity in terms of each switch device may potentially be obtained. The use of a number of switch devices, however, is also problematic as the number of devices increases, with accompanying power and heat issues.

Larger switch size also sometimes increases the possibility of improper design or improper manufacturer of the chip. Testing of larger switches, however, can at times be difficult, both with respect to internal switch operation as well as connections to the switch. Absent adequate testing capability of the switch itself, determination of whether a particular chip is bad or whether connections to the chip are flawed may be difficult.

Further, larger switches require increased programming when determining the output input connections. Indeed, in an extreme case operation of the switch may be delayed while continued programming of the switch occurs.

In addition, particularly at higher frequencies, data degradation may occur due to inter-symbol interference. Inter-symbol interference (ISI) can result when the bandwidth of a transmission media or an amplifying circuit is not sufficient to pass the frequency content of a data signal without attenuating or phase-shifting some of the constituent frequencies such that a data pulse will not reach its full amplitude. When the data pulse passes a given threshold level, a pattern-dependant jitter occurs. The pattern-dependant jitter is often due to the narrowing or widening of the data pulses that depends on the data pulses' voltage history. A signal that has been distorted in this way is difficult to recover error-free.

Typically, to prevent ISI, an amplifier is designed to have a flat gain versus frequency response past 0.7 times the bit data rate. However, this is often not feasible where numerous amplifiers in a chain are required to accomplish a signal processing function. For instance, the flat bandwidth of the circuit goes down as amplifiers are added. Power dissipation constraints or capacitive loading conditions also limit the feasibility designing an amplifier to prevent ISI. For example, reduced drive or increased loading lead to a reduction in gain at lower frequencies.

Conventionally, flattening the frequency response of amplifiers is performed through negative feedback which reduces the gain and extends the bandwidth. The use of variable-gain amplifiers is another possibility for trading bandwidth for gain.

One conventional approach for mitigating ISI in linear transmission media (not in amplifiers) is static or adaptive equalization, in static or adaptive equalization a circuit which inverts the characteristics of the medium is placed at the receiver (after the transmission medium) to produce a facsimile of the original signal.

However, it is not always possible to have adequate bandwidth in a chain of amplifiers and meet other design constraints simultaneously. Amplifiers with high bandwidth tend to dissipate more power and require more expensive IC processes.

If there is excess gain in the amplifier chain, negative feedback could be used to reduce gain and increase bandwidth, but this is not feasible if the output is not in proximity to the input. At high frequencies of operation, "in proximity" is in practice a very short distance, often far less than the input and output pins of an IC. Longer distances for the feedback path can result in delays that de-stabilize the feedback loop and cause it to oscillate. The feedback approach also assumes linear amplification. If limiting is required, reducing the gain via negative feedback will reduce or remove the limiting effect.

This situation often occurs in un-retimed (asynchronous) cross-point switch circuits. For such circuits, where the relationship between input and output ports is selectable, a feedback path is only established by doubling the required connections. Hence, a significant delay would result to cause the circuit to oscillate undesirably.

Furthermore, an equalization approach generally cannot be applied at the output of a chain of limiting amplifiers, because some of the original characteristics of the signal have been removed by the limiting operation.

SUMMARY OF THE INVENTION

In one embodiment the present invention provides a crosspoint switch unit. In one embodiment the crosspoint switch unit comprises a switch matrix module in a crosspoint switch. The switch matrix module comprises a first element including a semiconductor substrate with a plurality of active elements and a second element coupled to the first element. The second element includes a first set of transmission lines and a second set of transmission lines, the second set of transmission lines being orthogonal to the first set of transmission lines. The crosspoint switch comprises a plurality of programmable registers coupled to the plurality of active elements. Each active element of the plurality of active elements is coupled to one transmission line of the first set of transmission lines in one transmission line of the second set of transmission lines through a tap. In a further embodiment, inputs are coupled to the first set of transmission lines and outputs are coupled to the second set of transmission lines. The inputs and outputs are coupled to pads of a printed circuit board via a ball grid array.

In a further embodiment the crosspoint switch unit includes a passive network including capacitors and resistors tuned to compensate for signal degradation prior to the first set of transmission lines, with the network being embedded in the same die of the integrated circuit as the switch matrix module.

In a further embodiment the crosspoint switch unit includes a programming interface coupled to the switch core, with output level registers coupled to the outputs of the switch core controlling output levels of outputs of the switch core.

In general terms, the present invention provides a passive network within a signal path before a chain of amplifiers. The passive network has frequency characteristics approximate the inverse of the gain versus the frequency response of the chain of amplifiers over the region that is causing ISI.

The network includes series capacitors, and a combination of series resistors and shunt resistors, arranged such that the gain of the circuit is less than unity at low frequencies and rises with increasing frequency above a frequency determined by the desired maximum frequency of operation.

These and other aspects of the present invention will be more readily appreciated upon review of the following discussion and in view of the accompanying figures.

DETAILED DESCRIPTION

Figure 1:
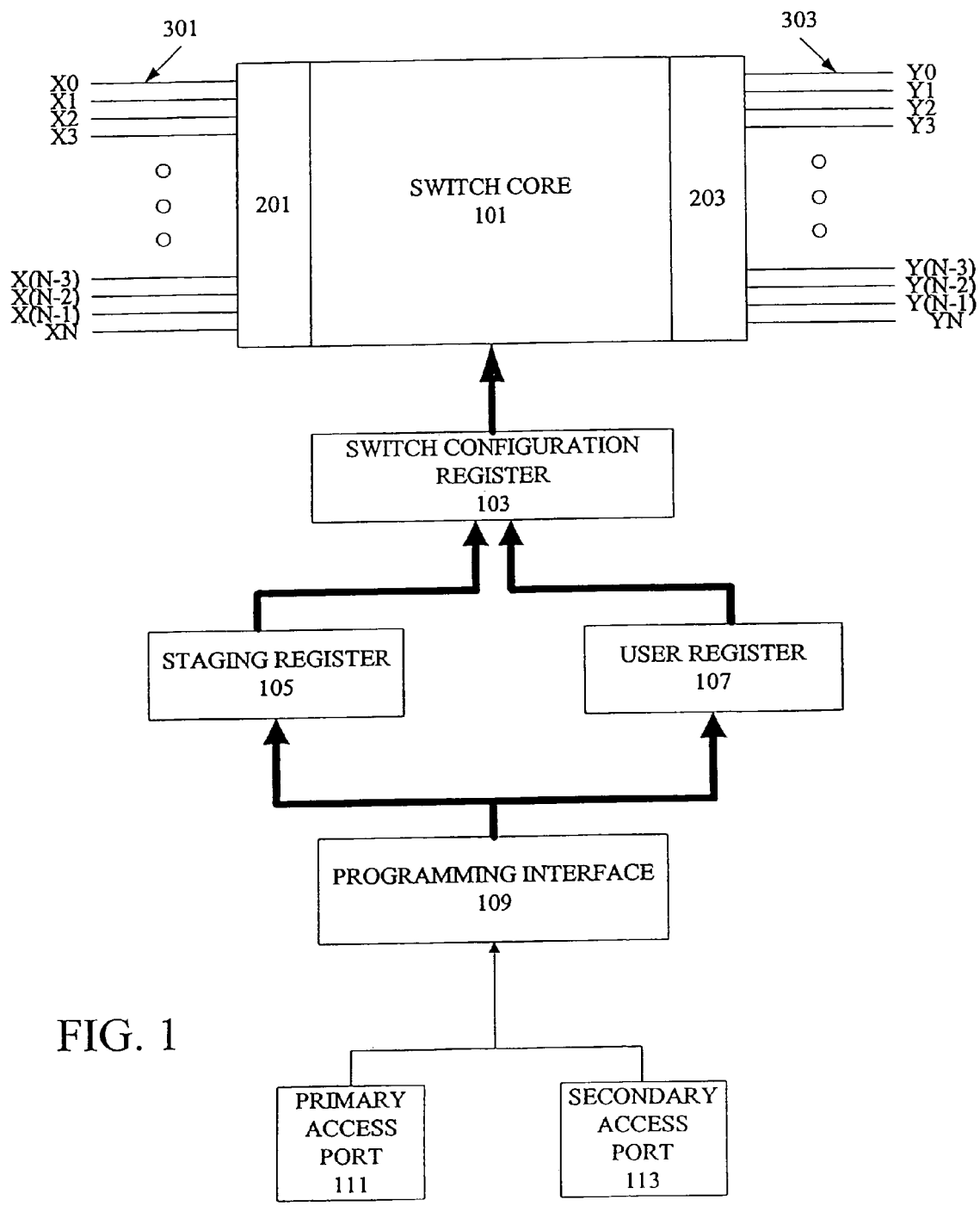
FIG. 1 is a block diagram of a cross switch in accordance with aspects of the present invention.

FIG. 1 illustrates a block diagram of one embodiment of a switch of the present invention. The switch includes a switch core 101, a switch configuration register 103, a staging register 105, and a programming interface 109. In somewhat more detail, the switch core couples signals from an input bus 301 to an output bus. The switch configuration register determines which output signals of the output bus are derived from which signals of the input bus. The staging register provides a temporary programming register, the contents of which are transferred to the switch configuration register when remapping of the outputs to the inputs is desired. The staging register is accessed using the programming register. The input bus provides a number of signals each to input signal equalization circuits 201. The input equalization circuits are coupled to the switch core. Similarly, outputs of the switch core are coupled to output level control circuits 203 which are coupled to an output bus 303. As such, data transmitted on the input bus is transferred to the output bus via the input signal equalization circuits, the switch core and the output level control circuits.

The programming of interconnections in the switch core, i.e., which input is operationally coupled to which output, is carried out via the switch configuration register, staging registers, user registers and the programming interface.

The programming interface is coupled to a primary access port 111. Via the primary access port, the programming interface is used to provide read and write operations to the staging registers. Contents of the staging registers are transferred, upon command through the primary access port to a switch configuration register, the contents of which control switch connections.

Figure 3A:
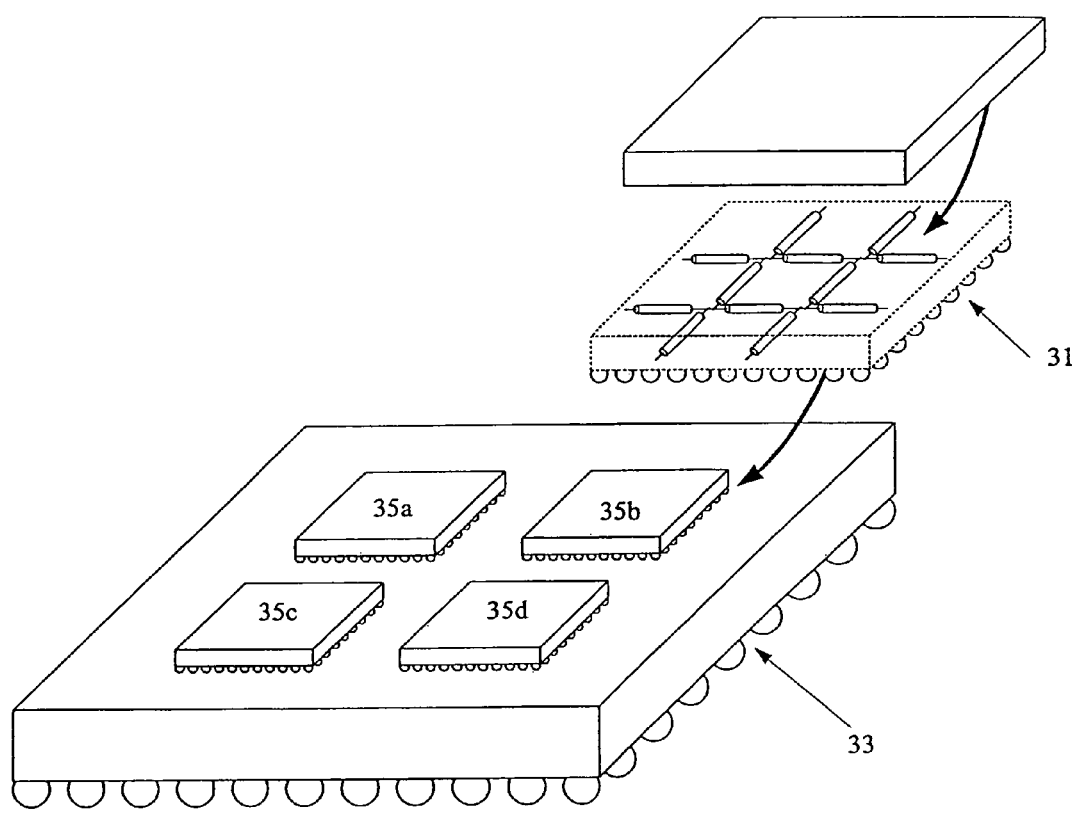
FIG. 3A illustrates physical structure of a switch having a plurality of switch elements on a substrate in accordance with aspects of the present invention.

In one embodiment the switch is comprised of a number of switch elements. As illustrated in FIG. 3A, each element, or matrix, includes a series of overlapping transmission lines. A first set of transmission lines on a first plane orthogonally crosses over a second set of transmission lines on a second plane. The number of the first set of transmission lines and the second set of transmission lines varies. In one embodiment, as shown in FIG. 3A, the first and second set of transmission lines are fabricated on a ball grid array (BGA) 31 and flip chipped onto another larger BGA 33. Signals provided to the switch matrix, i.e., input signals, are received by the first set of transmission lines. Signals produced by the switch matrix, i.e., output signals, are provided by the second set of transmission lines. The network is coupled to two or more transmission lines of the first set of transmission lines.

In the embodiment of FIG. 3A, the switch includes four switching elements 35a–d. A first and a third switch element, commonly adjacent a first side of the larger BGA as illustrated in FIG. 3A, receive input signals. The signals are routed to outputs of the switch using the first switch element and a second switch element. The third switch element and fourth switch element, commonly adjacent a second side of the larger BGA as illustrated in FIG. 3A, provide output signals. In operation, an input signal applied to the first switch element may be routed directly to the third switch element, or routed to the fourth switch element by way of the second switch element.

Figure 5:
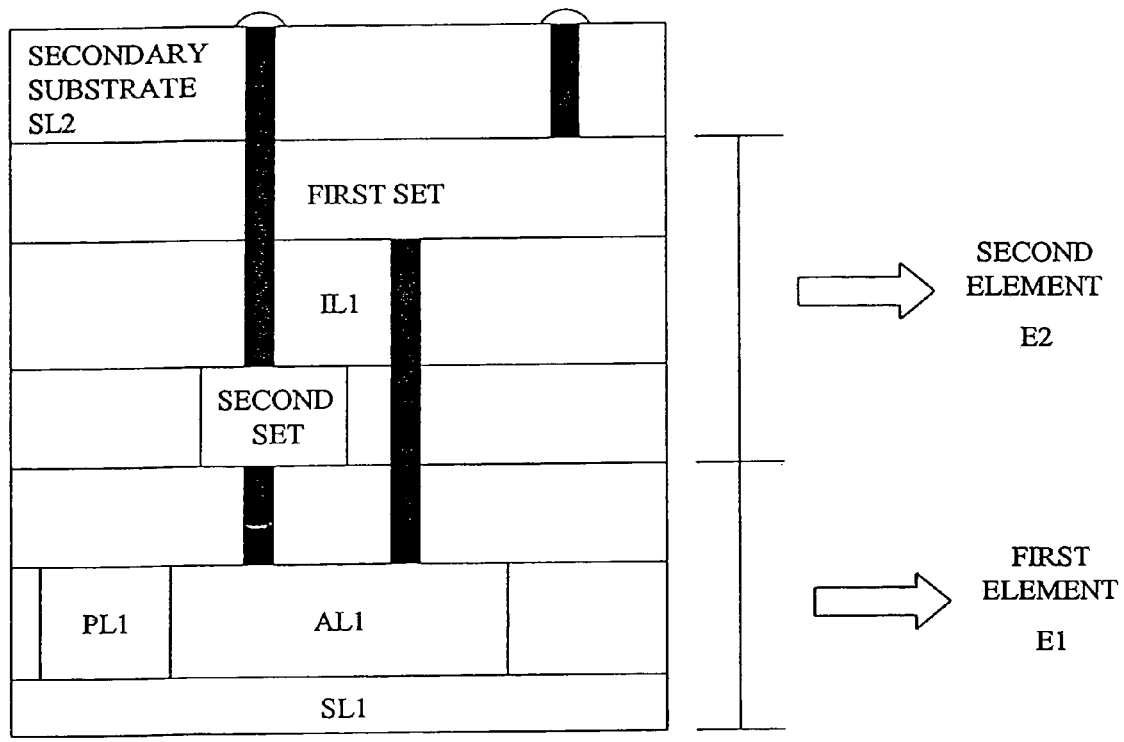
FIG. 5 illustrates a physical layout of a switch matrix in accordance with aspects of the present invention.

Further understanding of operation of the device of FIG. 3A is provided through FIG. 5. FIG. 5 illustrates one embodiment of the physical layout of the switch matrix. The switch matrix includes a first and a second element. The first element E1 includes a semiconductor substrate SL1 with a plurality of active elements AL1–ALN (with a first active element AL1 shown in FIG. 5) fabricated on and spaced throughout the substrate. A plurality of programmable registers PL1–PLN corresponding to the plurality of active elements are also (with a first programmable register PL1 shown in FIG. 5) included on the semiconductor substrate. Each of the plurality of programmable registers are commonly coupled and controlled by a programming interface (not shown).

The second element E2 includes a first layer of a first set of conducting transmission lines and a second layer of a second set of conducting transmission lines. The second set of conducting transmission lines are arranged to be orthogonal to the first set of conducting transmission lines. The first and second set of conducting transmission lines are separated by an insulating layer IL1. In one embodiment, the first and second set of conducting transmission lines are fabricated from a laminate of insulating material between a conducting layer having a pattern forming an array of multiple parallel controlled-impedance transmission lines. The placement of the active elements in the first elements is arranged to align with the intersections of the first set of conducting transmission lines with the second set of conducting transmission lines. Inputs to the switch matrix are provided at a first layer for the first set of conducting transmission lines. Similarly, outputs from the switch matrix are provided at a second layer for the second set of conducting transmission lines.

The first element is coupled to the second element which is then coupled to a secondary substrate SL2, such as a ceramic or flexible flip-chip substrate. The inputs and outputs of the switch matrix are coupled to pads on a printed circuit board by a ball grid array. Each active element of the first element is coupled to one of the first set of conducting transmission lines and one of the second set of conducting transmission lines through taps or a through via-hole. Each tap modifies the impedance characteristics of a conducting transmission line, i.e., the impedance of a transmission line. The tap, therefore, includes a capacitance and inductance.

In one embodiment, each of the transmission lines has a pre-determined width. However, near the junction of the transmission lines, each transmission line is narrowed to a second pre-determined width smaller than the first pre-determined width. As such, each tap approximately coupled to the junction of the transmission lines provides additional thickness to each transmission line but provides negligible impedance to each transmission line. Thus, the impedance of a particular transmission line is largely constant along its length.

In one embodiment, such as that illustrated in FIG. 3A, one or more switch matrices are coupled together. For instance, outputs of a first switch matrix are coupled to inputs of a second switch matrix and outputs of the second switch matrix are coupled to inputs of a third switch matrix and so on. Similarly, one or more switch matrices are provided on the same printed circuit board. Each individual switch matrix is controlled by a separate programming interface. That is, a separate programming interface is provided for each of the switch elements, or matrices, making up the switch. The use of a plurality of programming interfaces allows for increased speed of programming of the switch, particularly as the number of inputs, outputs, or switch elements is increased.

Figure 3B:
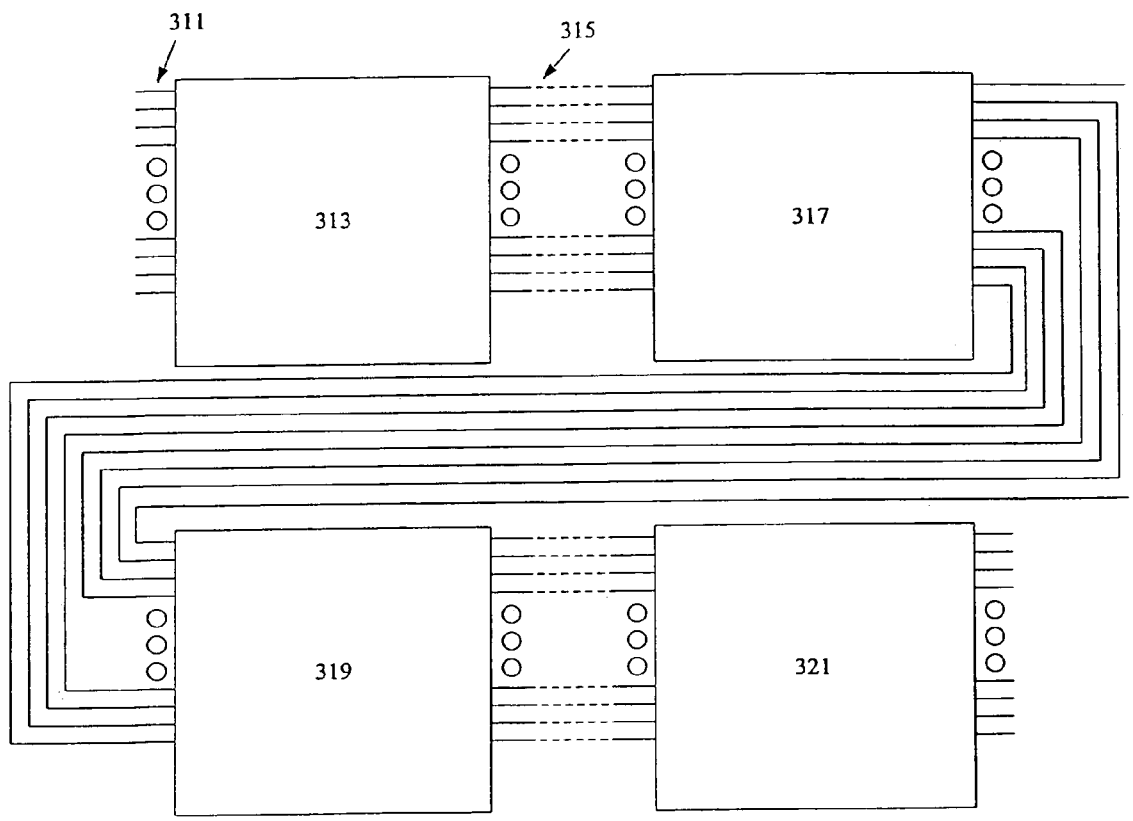
FIG. 3B illustrates the physical structure of FIG. 3A illustrating control connections between the switch elements.

Alternatively, some group of switch matrices may be controlled by one programming interface while other switch matrices are controlled by another programming interface. As another alternative, a single programming interface is used to program the switch elements. For example, FIG. 3B a system such as that of FIG. 3A in which a single programming port is used. The programming port is coupled by a plurality of signal lines 311 to a first switch matrix 313. The first switch matrix in turn has a number of signal lines 315 coupled to a second switch matrix 317. Similarly, the second switch matrix is coupled to a third switch matrix 319, and the third switch matrix is coupled to a fourth switch matrix 321. Programming information is passed on the signal lines from switch matrix to switch matrix in a daisy chain manner using the signal lines.

In one embodiment, use of or the meaning of programming information varies with respect to the location of a switch element within the set of switch elements. For example, for an input to the first switch element to be output through an output on the third switch element, the different switch elements generally should not respond in the same way to similar programming instructions. Accordingly, in one embodiment, each switch element is provided a signal dependent on the position of the switch element within the set of switch elements. In one embodiment the signal is provided through pins connected to elements on the larger ball grid array based on the position of the switch element. These pins are then used in interpretation of programming commands. For example, in one embodiment the signals are used to mask programming information, and in other embodiments are used in conjunction with the programming information.

Figure 2:
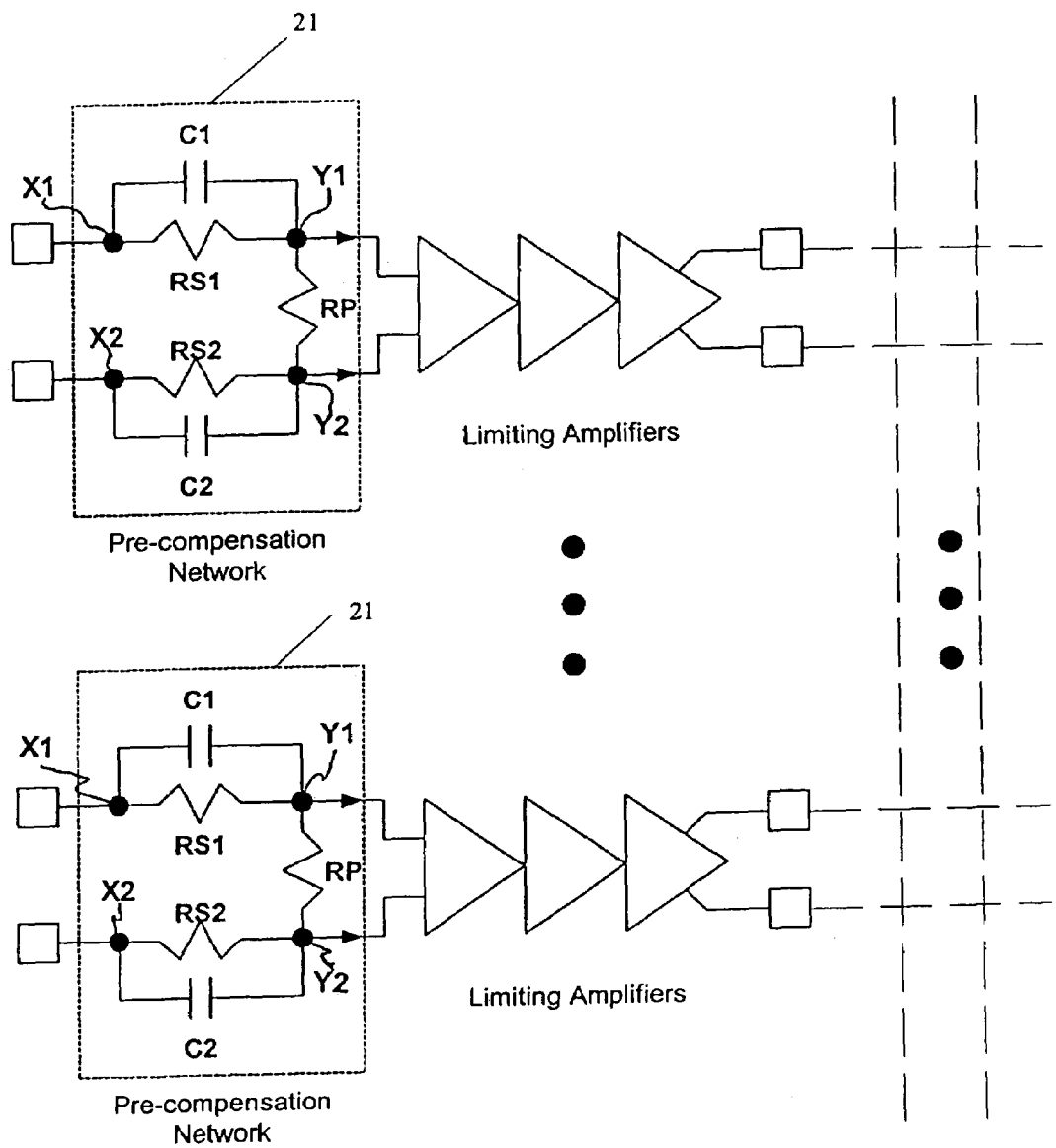
FIG. 2 is a pseudo-schematic of a network for reducing inter-symbol interference in accordance with aspects of the present invention.

In one embodiment, the switch passes differential signals. In FIG. 2, one embodiment of a passive network is shown for use in a differential signal path. The embodiment of FIG. 2 is used as an input signal equalization circuit 21 for the inputs to the switch. In one embodiment, the passive network is internal or fabricated into an integrated circuit. It has been found that including the passive network fabricated with the integrated circuit, e.g., the passive network is provided on the die of the integrated circuit, greatly reduces ISI as opposed to providing the network externally to the integrated circuit.

As illustrated in FIG. 2, the passive network includes series capacitors C1 and C2 having equal capacitance values C, series resistors RS1 and RS2 having equal resistance values RS and shunt resistor RP1 having resistance value RP. At low frequencies, the capacitors have high impedance compared to the series resistors RS1 and RS2, such that the gain of the network approaches a gain value equal to the result of the equation RP/(RP+RS1+RS2). At high frequencies, the capacitors C1 and C2 have low impedance compared to the shunt resistor, such that the gain of the network approaches a gain value of RP/RP or unity.

In one embodiment, the component values of the series capacitors are pre-selected, such that the impedance of the capacitors equals the resistance value RS approximately at the corner frequency of the amplifier chain and equals the resistance value RP at approximately the desired new corner frequency. Thus, the flat bandwidth of the amplifier is extended closer to the required fraction of the data bit rate.

Using the network with a modest ratio of high to low frequency gain, e.g., 2, allows the use of amplifiers that have half the bandwidth normally required and which dissipate half the power.

In one embodiment, the network is applied externally to an integrated circuit in order to remove ISI already in fabricated circuits. Due to the minimal number of components, the network is inexpensive to implement and sufficiently flexible to implement for a given application.

Also, since the network includes passive elements, these elements can be segmented and/or programmable (i.e., tunable). For instance, in one embodiment where the network is included in the integrated circuit, by changing upper metal layers on an integrated circuit, the elements of the network are manipulated and thus allowing for easy tuning of a circuit's ISI jitter characteristics.

In one embodiment, the elements of the network are tuned, such that it compensates for all or some of the signal degradation occurring in the transmission medium leading up to a crosspoint switch device. This is particularly valuable in applications where multiple stages of crosspoint switch devices are cascaded to form a large switch fabric having grossly non-ideal electrical or electro-optical connections between the switch devices. Thus, placing a network of the present invention between each of the cascaded crosspoint switch devices reduces signal degradation.

In one embodiment, referring back to FIG. 2, at point X1 between the capacitor C1 and the resistor RS1, a first input transmission line is coupled to the network. At point X2, between the capacitor C2 and the resistor RS2, a second input transmission line is coupled to the network. At point Y1, between the capacitor C1, the resistor RS1 and resistor RP1, a first transmission line of the first set of transmission lines is coupled to the network. Likewise, at point Y2, between the capacitor C2, the resistor RS2 and resistor RP1, a second transmission line of the first set of transmission lines is coupled to the network. Although only one transmission line is described above coupled to each point X1, X2, Y1 and Y2, multiple transmission lines can be coupled to the points.

Figure 4:
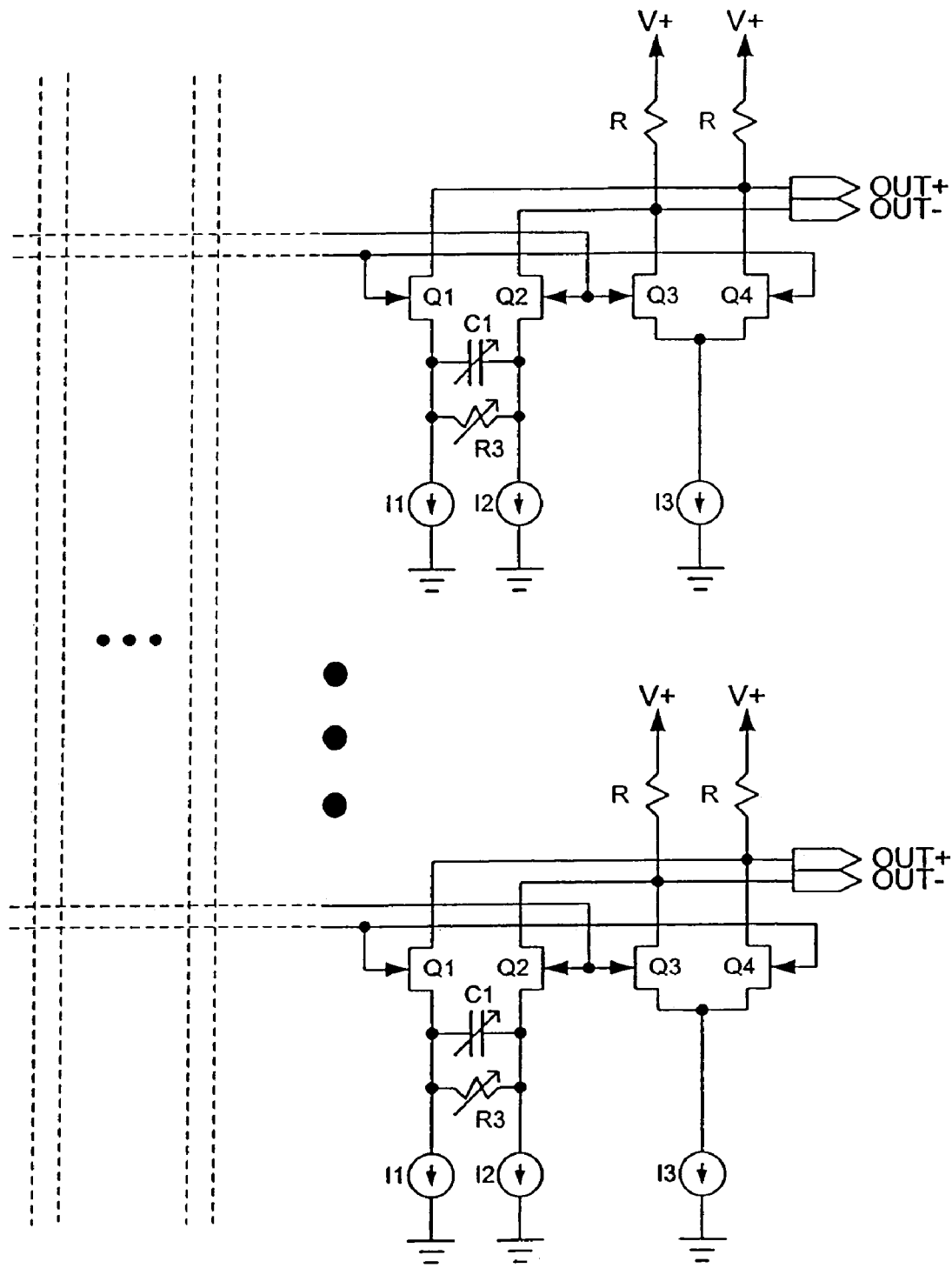
FIG. 4 illustrates an output compensation network in accordance with aspects of the present invention.

The switch matrices in one embodiment also include output pre-emphasis circuitry. The output pre-emphasis circuitry is adapted to drive signals over loads, with decreased reduction of higher frequency components of the signal. FIG. 4 is a semi-schematic of output pre-emphasis circuit providing differential outputs of the switch matrices. The circuit is comprised of a first capacitively coupled differential pair and a second differential pair. The capacitive element coupling the first differential pair is selectable, i.e. tunable. In one embodiment this is accomplished using an array of selectable capacitors in series or in parallel, selectable using register bits. A resistive element also coupled between the first differential pair, and the resistive element is similarly selectable.

Figure 6:
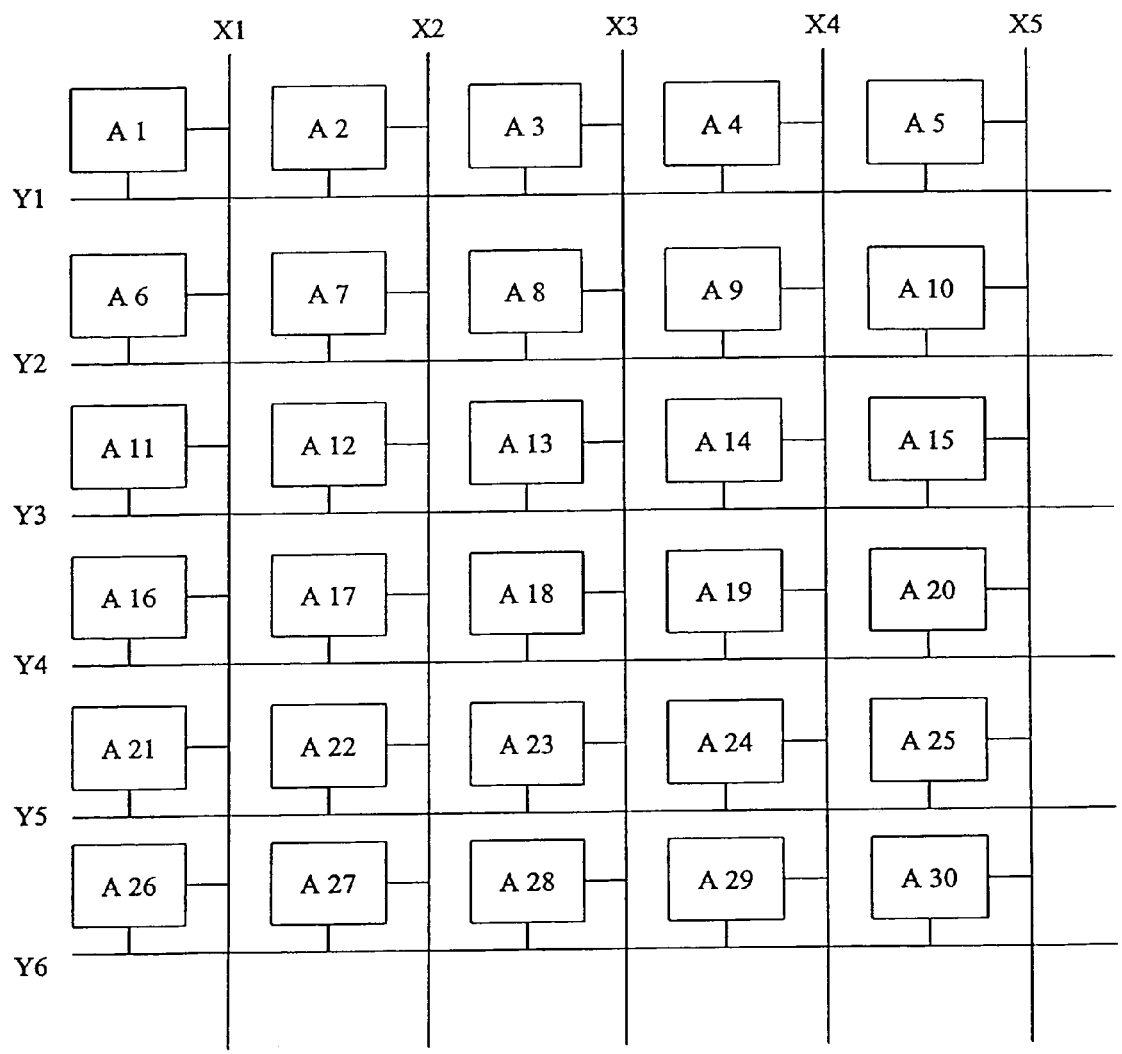
FIG. 6 illustrates a block diagram of a switch matrix in accordance with aspects of the present invention.

Returning to switch operation, FIG. 6 illustrates an overview of one embodiment of the crossbar switch matrix of the present invention. The switch matrix includes a series of overlapping transmission lines. A first set of transmission lines X1–X5 on a first plane orthogonally crossing over a second set of transmission lines Y1–Y5 on a second plane. The number of the first set of transmission lines and the second set of transmission lines varies. Signals provided to the switch matrix, i.e., input signals, are received by the first set of transmission lines. Signals produced by the switch matrix, i.e., output signals, are provided by the second set of transmission lines.

Active elements A1–A30 couple the first set of transmission lines and the second set of transmission lines. The number of active elements depends on the number of transmission lines X1–X5 and Y1–Y6. As such, each active element operationally couples one of the first set of transmission lines to one of the second set of transmission lines. Accordingly, near each junction of the first set of transmission lines and the second set of transmission lines Y1–Y6, an active element is coupled to one of the first set of transmission lines and one of the second set of transmission lines. For instance, active element A3 operationally couples transmission line X1 to transmission line Y3.

Figure 7:
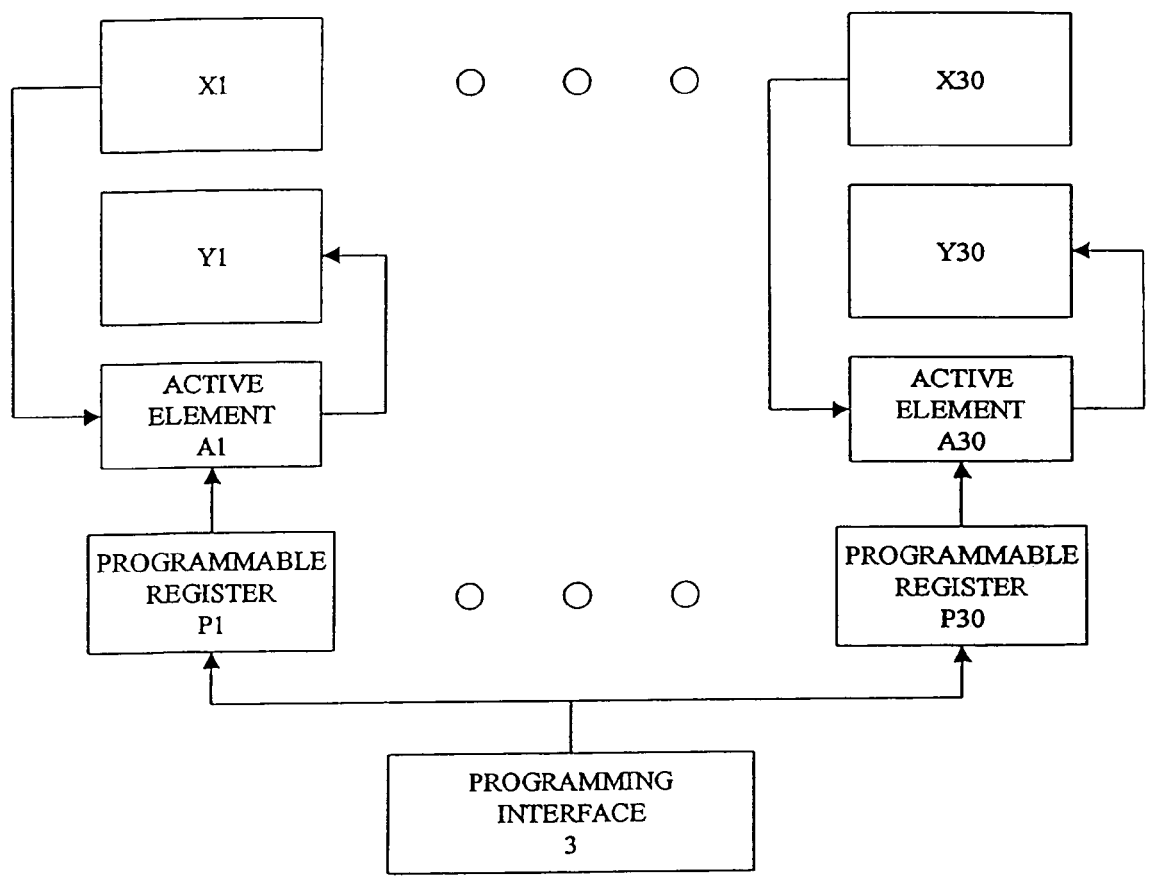
FIG. 7 illustrates a block diagram of data flow and control of switch inputs and outputs in accordance with aspects of the present invention.

Power supplied externally (not shown) to the switch matrix supplies the power used by each of the active elements. Referring to FIG. 7, each active element is coupled to a programmable register P1–P30. The number of programmable registers corresponds to the number of active elements. Thus, in the described embodiment, thirty active elements are provided coupled to thirty programmable registers. For clarity, only two of the active elements with two programmable registers are shown, as it should be recognized that the number of active elements and programmable registers may be numerous. In one embodiment, each programmable register represents a programmable bit in a programmable register. For instance, for thirty active elements, thirty programmable bits are stored in one programmable register.

Referring back to FIG. 7, each programmable register includes two states, i.e., "active" or "inactive". When the programmable register is in the "active" state, the programmable register activates the active element, i.e., turns the active element "on". Once, the active element is "on", the active element couples or provides an electrical path from one of the first set of transmission lines to one of the second set of transmission lines. For instance, referring to FIGS. 6 and 7, if programmable register P7 coupled to active element A7 is "active", active element A7 turns "on" to couple transmission line X2 to transmission line Y2. Thus, an input signal received by transmission line X2 is transferred to transmission line Y2. In one embodiment, output drivers are coupled to the second set of transmission lines to supply any gain or amplification required for the output signals. Hence, the switch matrix is able to operate at low power and low noise, leaving the output drivers to provide any needed power for a prescribed signal strength of each output signal.

Output signals transmitted along the second set of transmission lines are receivable on both ends of the transmission lines. For example, referring to FIG. 2, a signal on transmission line Y2, is receivable on one end of the transmission line Y2 near active element A6 and also receivable on the opposite end of the transmission line Y2 near active element A10.

The active element, in one embodiment, is an amplifier such as a transistor set up in an emitter follower configuration with base of the transistor coupled to one of the first set of transmission lines and the emitter of the transistor coupled to the second set of transmission lines. The collector of the transistor is coupled to the programmable register to control the state of the transistor. For instance, to turn the transistor "on", a signal is provided to the collector of the transistor to bias the transistor, thus a signal from the first set of transmission lines coupled to the base is transferred to the second set of transmission lines coupled to the emitter of the transistor less one diode drop. In another embodiment, the active element is a transistor set up in an open collector configuration.

Each programmable register is coupled to a programming interface. The programming interface 3, in one embodiment, includes addresses in a programming space. The addresses are provided as an array or serially and correspond to a programmable register. The programming interface 3 by using the addresses, the programming interface is configured to program the corresponding programmable register to be "active" or "inactive" and thus, respectively, turn "on" or "off" the corresponding active element.

Accordingly, through the programming interface, the switch matrix is able to be configured to permit only one active element, out of the active elements coupled to the same transmission line of the second set of transmission lines, to be "on" at a given time. Hence, two or more active elements coupled to the same transmission line of the second set of transmission lines cannot be "on". For instance, referring back to FIG. 2, if active element A4 is "on", active elements A9, A14, A19, A24 and A29 are "off". Similarly, corresponding programmable registers C9, C14, C19, C24 and C29 are "inactive", while programmable register C4 is "active".

Similarly, through the programming interface, the switch matrix is able to be configured in a broadcast or multi-cast mode, such that a signal transmitted on only one of the first set of transmission lines is transferred to all of the second set of transmission lines. For example, referring to FIG. 2, in broadcast mode, an input signal on transmission line X3 is transmitted to the transmission lines Y1–Y6 with active elements A3, A8, A13, A18, A23 and A28 turned "on".

At times the entire switch fabric is to be reprogrammed. In such instances the programming of the switch may require excessive amounts of time, and potentially could result in switch down time if the interval of switch use in a particular configuration is less than the time required to program the switch configuration. Accordingly, in one embodiment an automatic increment programming function is provided. The automatic increment programming function is activated by command through the programming interface.

When the automatic increment programming function is activated each output of the switch is sequentially mapped to a specified input. In other words, the output to be mapped is not specified by a programming command. Instead the outputs are assumed to be being programmed sequentially, and the output to be mapped to a particular input is not specified. Thus, the first input, which may be any of the inputs to the switch, provided through the programming interface is mapped to the first output. A second input, which also may any of the inputs to the switch, is mapped to the second output, and so on.

Figure 8:
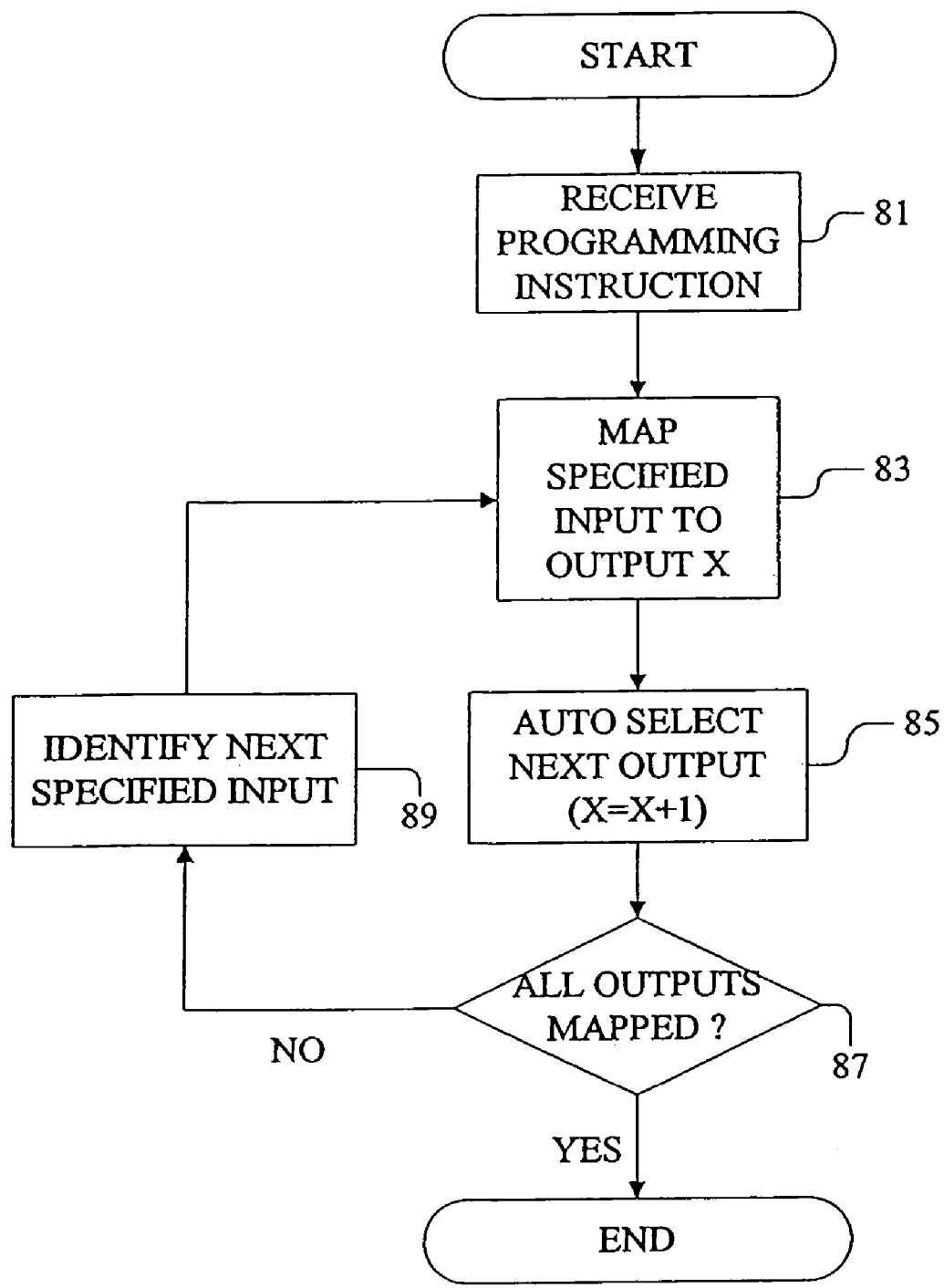
FIG. 8 is a flow diagram of a process programming a cross switch using an auto-increment function.

In FIG. 8, the process receives the programming instruction/data from the programming interface to configure the interconnections of the switch core in block 81. In block 83, the process maps the input specified in the programming data to the first output, i.e., x equals 1. In one embodiment, the programming data identifying the specified input to be connected to the first output is generated and transferred to the switch core. The process auto-increments the selection of the next output, i.e., the second output is selected (x equals two), in block 85. In block 87, the process determines if all the outputs of the switch core have been mapped to a specified output, i.e., x equals the maximum number of outputs. If all the outputs have been mapped the process ends. However, if additional outputs still remain to be mapped, the process identifies the next specified input from the programming data in block 89. The process, in block 83, the maps the next specified input with the next consecutive output.

In a further embodiment, the switch matrix module also includes a striping mode. In striping mode a plurality of inputs are mapped to a plurality of outputs in a single programming instruction. In one embodiment, the groups of inputs/outputs are selected based on the physical placements relative to the packaging of the switch matrix module and numerical order of the inputs/outputs.

For example, in one embodiment using a 144 by 144 switch matrix module, the switch matrix module has 36 input stripes and 36 output stripes. Each input stripe defines a group of four inputs, e.g., X0, X2, X4 and X6. Each output stripe defines a group of four outputs, e.g., Y33, Y35, Y37, Y39. As such, each input stripe can be configured to be operationally coupled to each output stripe.

In one embodiment, a binary code provided via the address/data bus selects a particular input or output stripe. In one embodiment, the inputs/outputs are numbered consecutively in which even inputs/outputs are on one side of the switch matrix module and odd inputs/outputs are on the other side of the switch matrix modules. Therefore, groups of inputs and outputs are groups of even and odd inputs and outputs, e.g., X56, X58, X60 and X62 or Y113, Y115, Y117 and Y119.

Figure 9:
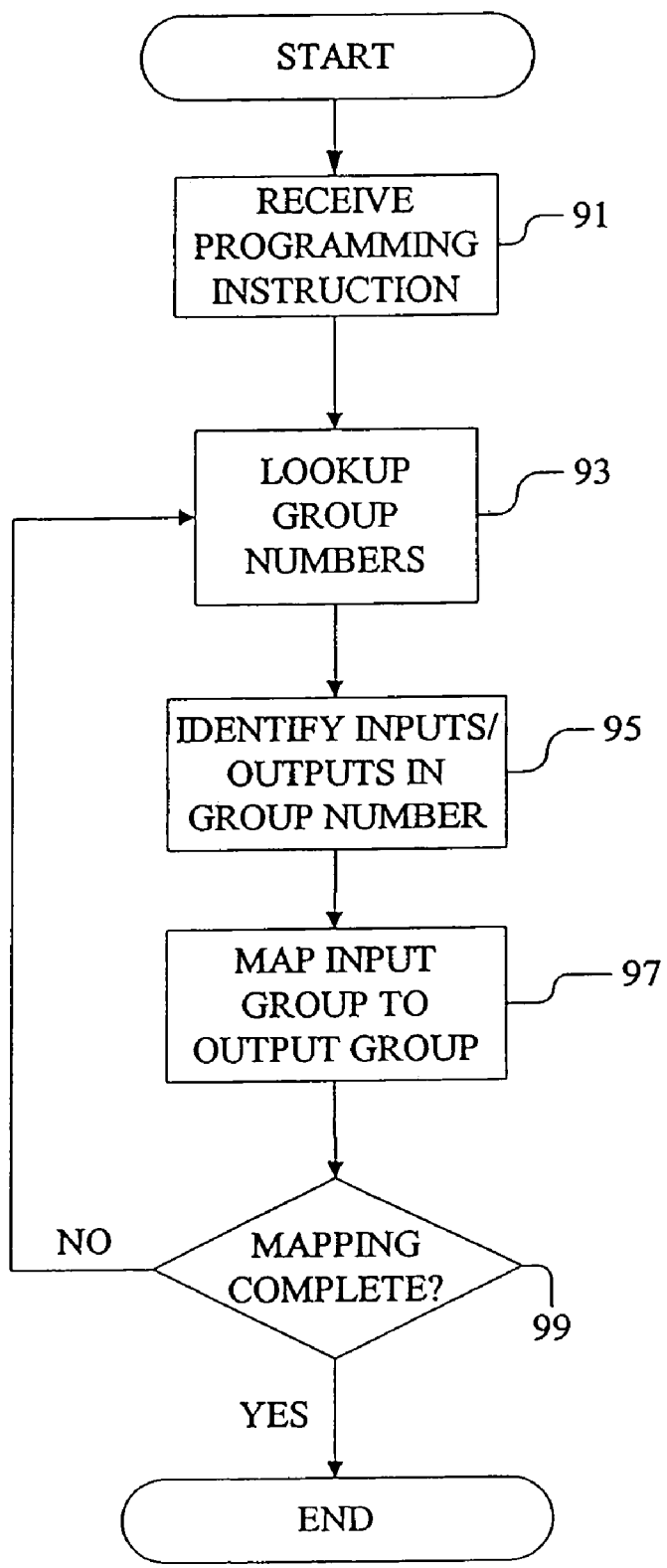
FIG. 9 is a flow diagram of programming a cross switch using a striping function.
Figure 10:
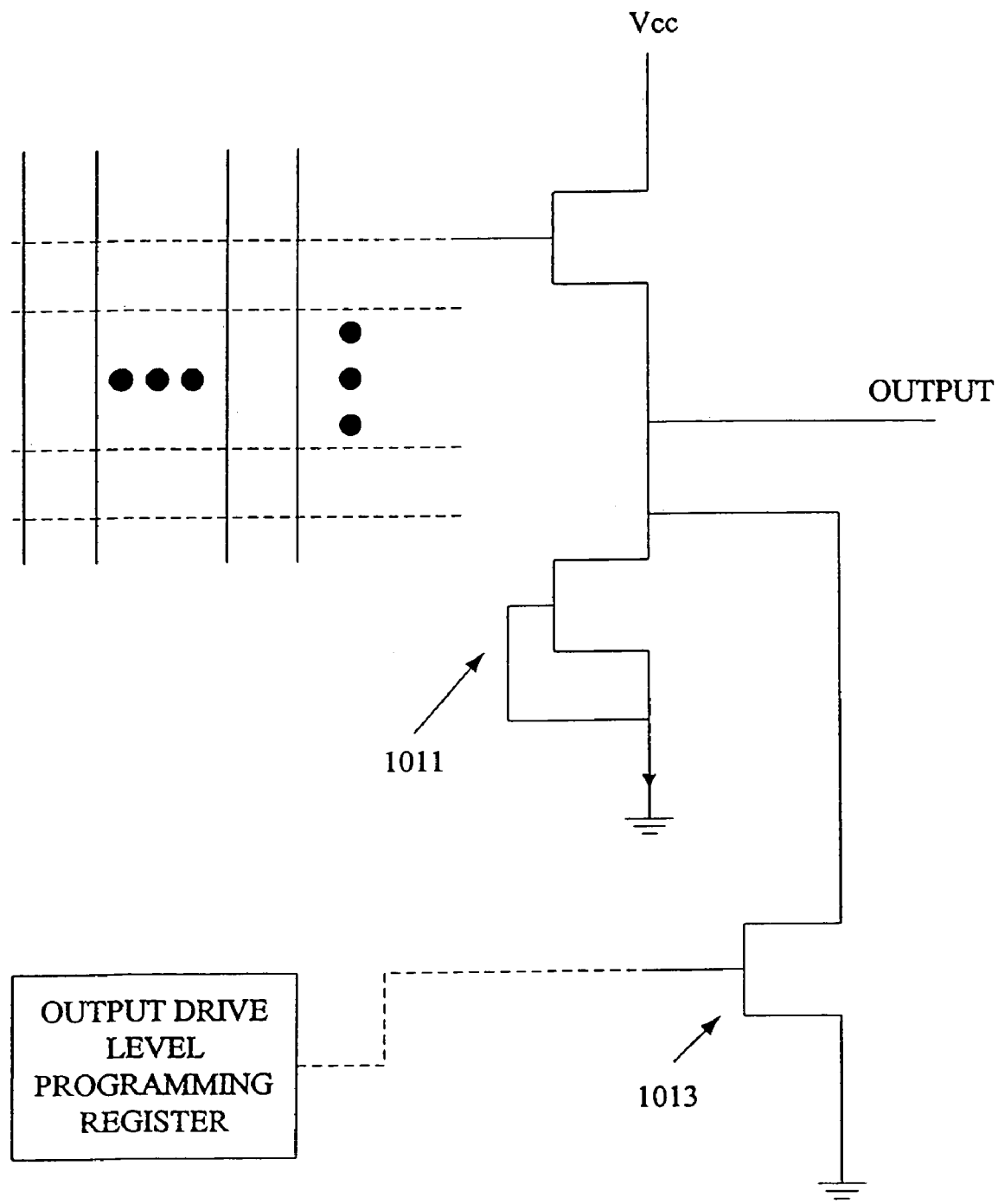
FIG. 10 is a semi-schematic of a programmable output drive in accordance with aspects of the present invention.

In FIG. 9, the process receives the programming instruction/data from the programming interface to configure the interconnections of the switch core in block 91. In block 93, the process identifies the group numbers specified in the programming data. In block 95, the process identifies or associates the group numbers with the appropriate groups of inputs and outputs. For example, a group number 1 and 15, in one /embodiment, would identify inputs X0, X2, X4 and X6 and outputs Y30, Y32, Y34 and Y36. The process, in block 97, maps the input group to the output group. For example, input group 1 (X0, X2, X4, X6) with output group 15 (Y30, Y32, Y34, Y36). As such, interconnections between the inputs defined in the input group are established to the respective outputs defined in the output group. In other words, for example, input X0 is operationally coupled to output Y30, input X2 is operationally coupled to output Y32, and so on. In block 99, the process determines if all the group mappings identified in programming data has been performed, i.e., if additional group mappings are needed. If no additional group mappings need to be performed the process ends. Otherwise, the process repeats continuing to block 93 to identify the groups specified in the programming instruction.

The switch matrix module includes a reset state in which interconnects of the switch matrix module is initialized via the programming interface. In other words, at initialization each input is mapped to one or more outputs. In one embodiment, the switch matrix module includes a user defined reset state. The user defined reset state initializes the interconnects of the switch matrix module according to the definitions set, or programmed, by a user. The user defined reset state allows for bulk transfer of a user defined state, which may be defined for example by a user at the beginning of system operation, upon a reset command. Such a capability is useful not only at general system resets, but at other times as well. For example, a particular switch configuration may be commonly expected. In such a circumstance, programming of the commonly expected switch configuration may be easily accomplished by commanding a system reset with the appropriate configuration previously set.

In one embodiment, therefore, referring back to FIG. 1, a user initialization register 107 is placed in parallel with the staging register. A reset command commands the contents of the user initialization register to be transferred to the switch configuration register. Thus, when the user defined reset state is activated, the programming information saved in the user registers are transferred out and the interconnects of the switch matrix module are initialized according to the programming information from the user registers.

In one embodiment, the user defined reset state is set using a save user initialization bit that when set low programming information is transferred from the staging registers to the user registers. Likewise, the user defined reset state is set using a user initialization bit that when set high the interconnects of the switch matrix module are initialized according to the user defined settings, as the programming information from the user registers are transferred out.

As noted above, in reference to FIG. 1, the switch includes a primary access port coupled to the programming interface. In the event that the primary access port is busy or otherwise occupied, in one embodiment, the switch includes a secondary access port 113. The secondary access port is coupled to the programming interface and is configured to communicate with the programming interface independent of the primary access port. In particular, the secondary access port allows asynchronous "readback" of connection states of the switch matrix module, while the primary access port is actively programming the switch. Readback refers to retrieving, i.e., reading back, current pending information from a register coupled to the switch matrix module. For example, the programming information in the staging registers or the user registers are retrieved by activating the readback control. The secondary access port also allows configuration control of the switch matrix module, such as control operation of the DRIVE and SENSE connections, input equalization, output drive level control, boundary scan operations, temperature sensing and pseudo-random binary sequence (PRBS) functions.

In one embodiment, the switch matrix module is configurable using the switch configuration register to provide a high drive level and a low drive level for each output pin. Each output is provided a current source 1011. The amount of current provided by the current source is controlled by a signal from a corresponding bit in the switch configuration register. When the bit is high, indicating a high drive level, the current source is provided a signal to a gate of the current drive source resulting in the current source providing additional current.

In an alternative embodiment only a single bit in the configuration register is provided to control output drive levels, and all output drive levels are commanded to either a high or low drive level. In such an embodiment, a signal generated using the single bit in the configuration register is provided to all output current sources.

Figure 11:
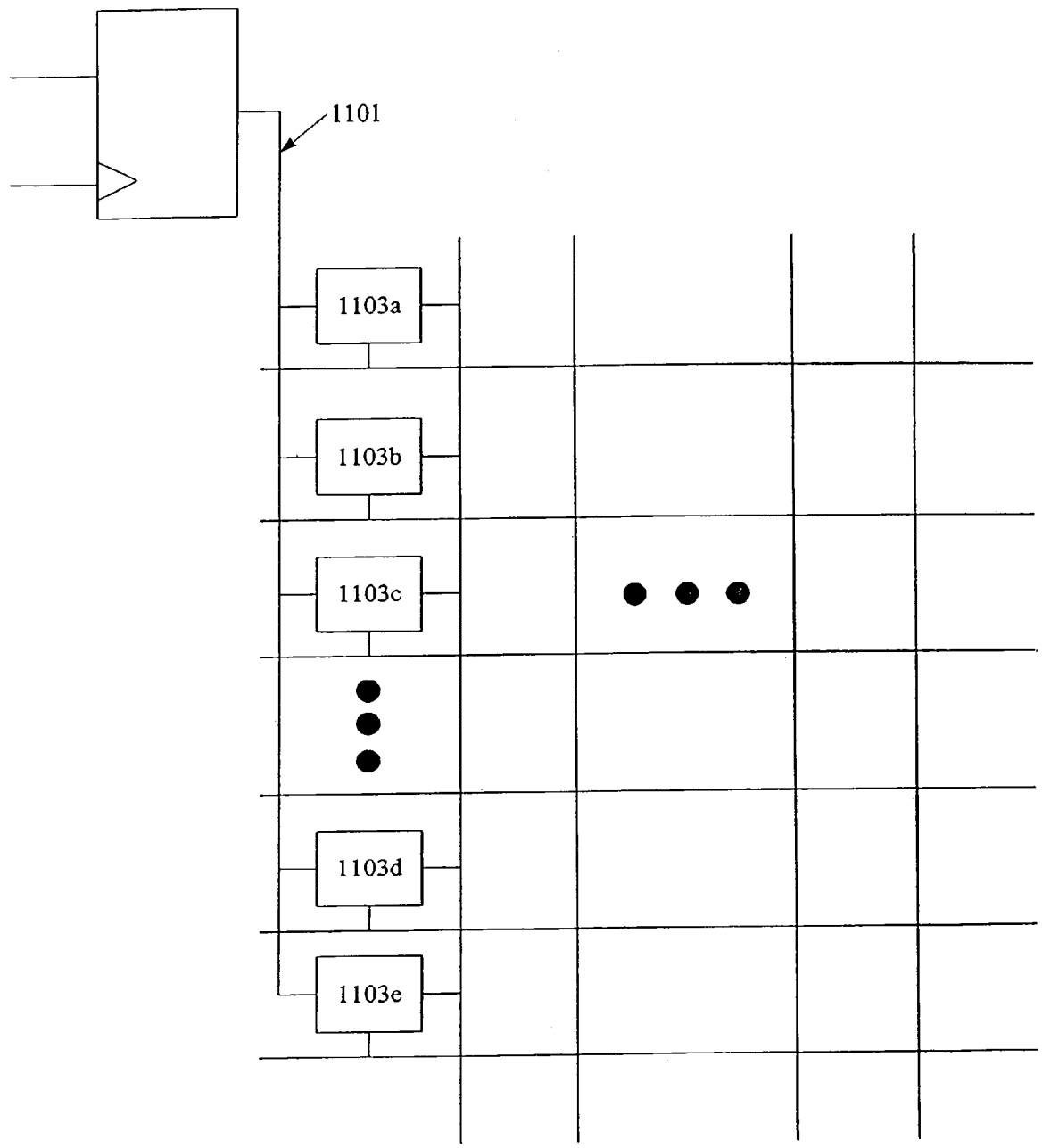
FIG. 11 is a block diagram illustrating a drive line in accordance with aspects of the present invention.

In one embodiment drive and sense functions are also provided. The drive function drives an input line of the switch fabric to a specified state. The sense function senses the state of a an output line of the switch fabric. FIG. 11 is a block diagram illustrating a drive line. As illustrated, the drive line runs across the top of the input lines, and does so prior to the input line encountering any active elements. Thus, in one embodiment the drive line crosses the input lines approximate the input pins to the device.

The drive line is coupled to the input lines by active elements 1103a–e. The active elements, in one embodiment, are controlled by bits set in a programmable register. Setting appropriate bits in the programmable register turns on a specified active element, and couples the drive line to a specified input data line.

In another embodiment the drive line runs physically across the input data lines. Transistors are placed in the drive line between input data lines, with the drains and sources of the transistors being coupled to the drive line. In order to drive the first input line with the drive line a first transistor is turned on. In order to drive the second input line with the drive line the first transistor and a second transistor are turned, and so on.

The drive line is, to an extent, a control point. Accordingly, use of the drive line is beneficial in several aspects. For example the drive line may be used to check connection integrity of the input data lines to external signal sources. Use of the drive line may also be convenient for checking internal device operation, particularly if the drive line may be coupled to the input data lines approximate the inputs to the device.

Similarly, an output drive line is provided for the outputs of the switch. The output drive line is multiplexed with the output signal approximate the output signal driver, with the output signal driver outputting either an output data signal or the signal on the output drive line based on contents of the switch configuration register.

Figure 12:
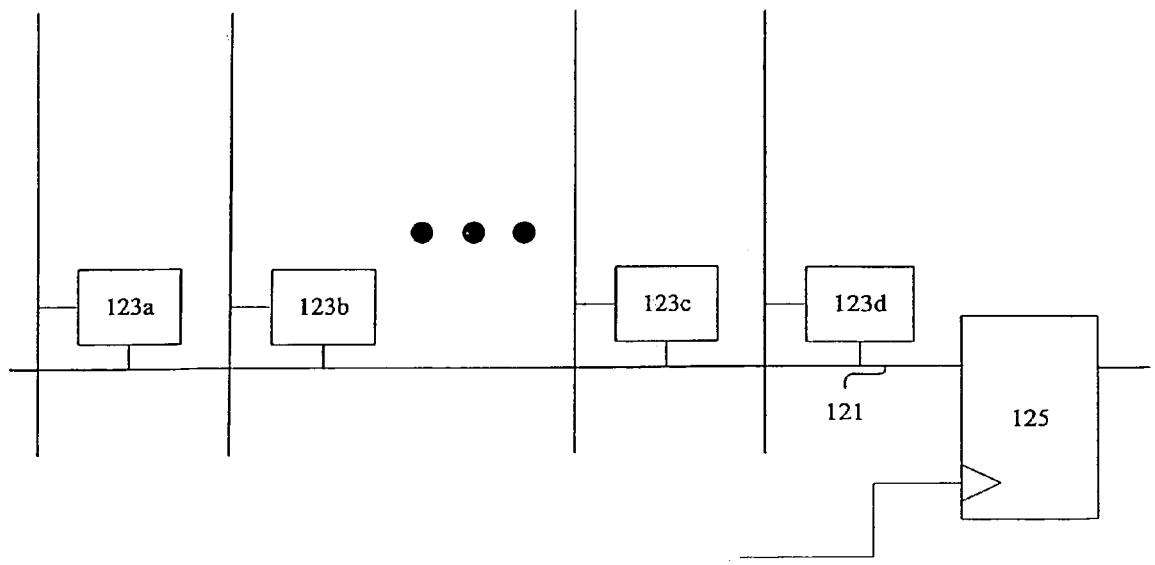
FIG. 12 is a block diagram of a sense function in accordance with aspects of the present invention.

FIG. 12 illustrates an example of a sense function. As illustrated a sense line 121 is placed over the data output lines of the device. Active elements 123a–d couple the sense line to the data output lines. Control of the transistors is as described with respect to the drive function, except turning on an active element drives the sense line to the state of the selected output line.

A latch 125 is placed at one end of the sense line. The latch is also provided a latch signal, in one embodiment externally generated, commanding the latch to maintain the state of the sense line at a particular point in time. In one embodiment the latch signal is externally generated, and may be a clock signal, and in another embodiment the latch signal is an internally generated relatively low speed clock signal. The use of a relatively low speed clock signal allows the latch to operate at speeds significantly less than possible data rates of the device.

In operation, therefore, data may be placed on a particular input data line using the drive line. Data may also be read from a particular output data line using the sense line. Coupling the two data lines together allows for device integrity checking and boundary scan capabilities.

Figure 13:
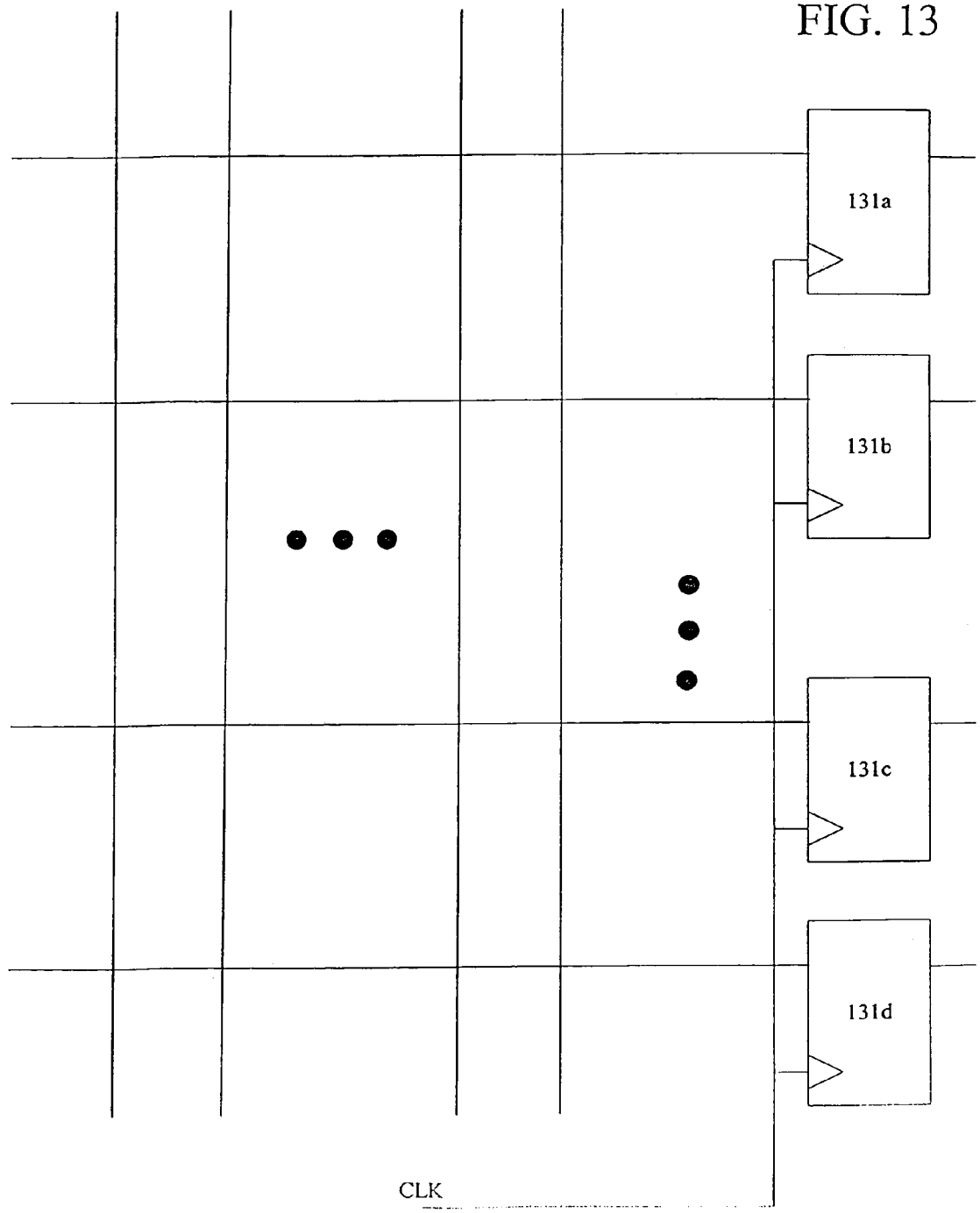
FIG. 13 is a block diagram of an output clocking circuit in accordance with aspects of the present invention.

In a further embodiment high speed latches 131a–d are provided approximate the end of output lines, as is illustrated in FIG. 13. The high speed latches allow for clocking of the data output from the device. Generally, within the device signal propagation times vary with changing path lengths as the switch reconfigures. Accordingly, if the switching device is asynchronous, the output data on any one output line may experience variations in when signal transitions from high to low or low to high occur. Such variations may result in loss of lock by later downstream devices, particularly if the variation results in a downstream device attempting to sample the output data about transition points.

Latching of the output data allows for clocking of the output data stream. In one embodiment, the latching of the data may vary somewhat in time, but is limited to a relatively small range within the expected period of a signal. In other words, if data is passing through the switch at a known periodic rate, the latching of the data is accomplished within a limited range of that period.

Figure 14:
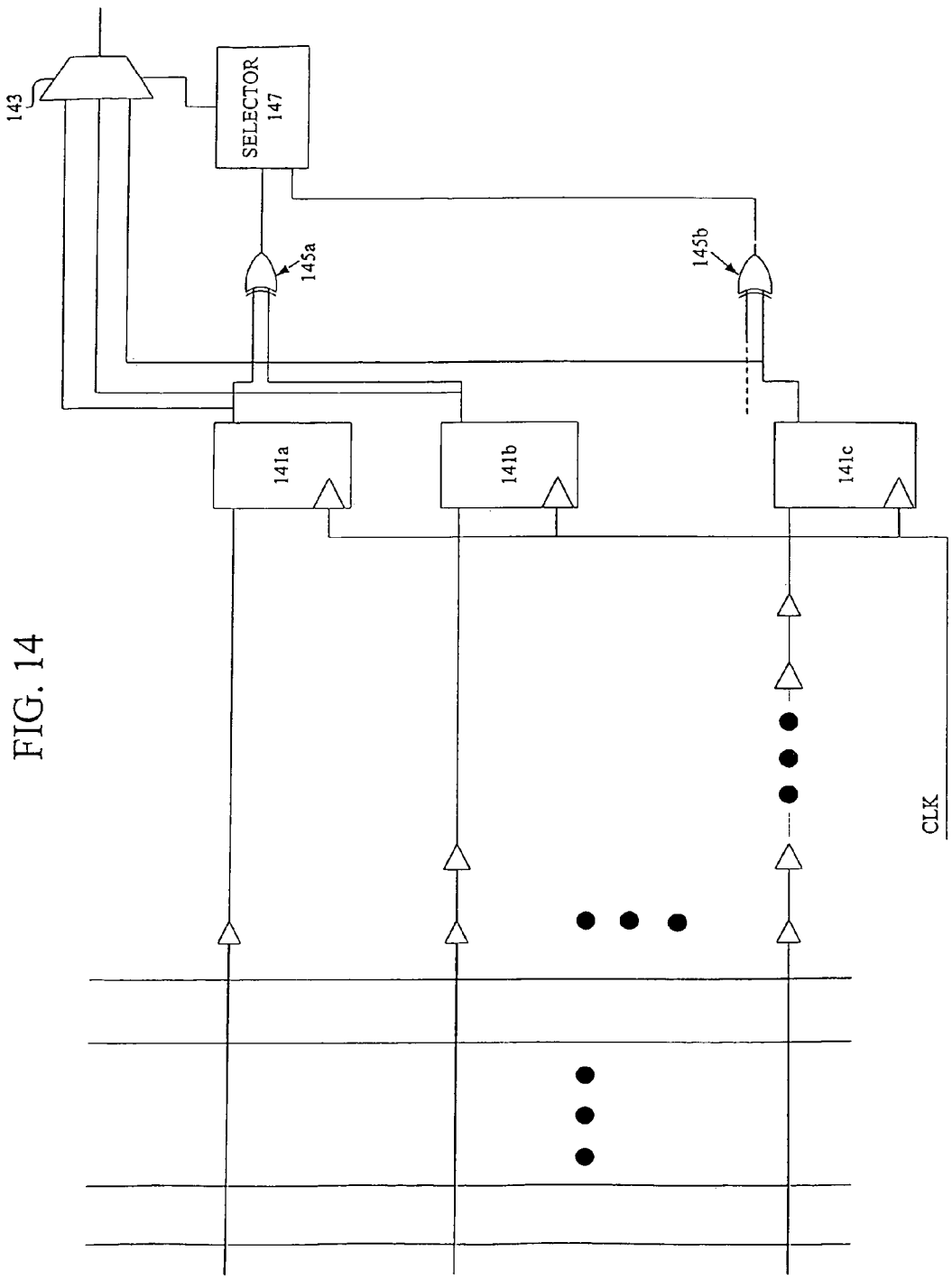
FIG. 14 is an output clocking circuit for performing the output clocking of FIG. 13.

FIG. 14 illustrates a circuit for providing a latching signal to an output latch. The circuit includes a number of latches 141a–c. Each of the latches has as a data input the output data line, with each data input to a latch slightly delayed with respect to one another. The latches are therefore arranged in a set, with each subsequent latch in the set receiving a data signal with a slightly greater delay.

The outputs of the latches are provided to a demultiplexer 143. The outputs of the latches are also provided to XOR gates 145a–b, with each XOR gate receiving inputs from two adjacent latches in the set of latches. Accordingly, a high output from a particular XOR gate indicates the presence of a data transition. The outputs of the XOR gates may therefore be used in a selector function 147 to provide a select signal to the demultiplexer, with the select signal selecting an output of a particular latch farthest from the transition point.

Accordingly, the present invention provides a switch matrix. Although this invention has been described in certain specific embodiments, many additional modifications and variations would be apparent to those skilled in the art. It is therefore to be understood that this invention may be practiced otherwise than as specifically described. Thus, the present embodiments of the invention should be considered in all respects as illustrative and not restrictive.

What is claimed is:

1. A crosspoint switch unit comprising:
a first set of transmission lines configured to receive a signal;
a second set of transmission lines selectively coupled to the first set of transmission lines;
an amplifier chain coupled to inputs of the first set of transmission lines; and
a tunable input signal equalization circuit coupled to the amplifier chain;
wherein the tunable input signal equalization circuit is configured so as the impedance of the tunable input signal equalization circuit is tuned to the frequency response characteristics of the amplifier chain, thereby reducing noise in the signal and improving the performance of the amplifier chain.

2. The unit of claim 1 further comprising a monolithic integrated circuit substrate and wherein the first and second set of transmission lines are coupled to the substrate.

3. The unit of claim 1 further comprising a monolithic integrated circuit substrate and wherein the input signal equalization circuit is fabricated on the substrate.

4. The unit of claim 1, wherein the amplifier chain comprises a differential signal path.

5. The unit of claim 1, wherein the tunable input signal equalization circuit is configured such that the bandwidth of the amplifier chain is increased.

6. The unit of claim 1, wherein the tunable input signal equalization circuit is tuned such that the power consumption of the amplifier chain is decreased.

7. The unit of claim 1, wherein the amplifier chain is coupled between the first set of transmission lines and the tunable input signal equalization circuit.

* * * * *